US010957529B2

(12) United States Patent
Lee (10) Patent No.: US 10,957,529 B2
(45) Date of Patent: Mar. 23, 2021

(54) METHOD FOR DRYING WAFER WITH GASEOUS FLUID

(71) Applicant: Taiwan Semiconductor Manufacturing Co., Ltd., Hsinchu (TW)

(72) Inventor: Chung-Chieh Lee, Taipei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 253 days.

(21) Appl. No.: 15/410,239

(22) Filed: Jan. 19, 2017

(65) Prior Publication Data

US 2018/0151348 A1  May 31, 2018

Related U.S. Application Data

(60) Provisional application No. 62/426,877, filed on Nov. 28, 2016.

(51) Int. Cl.
| | |
|---|---|
| *H01L 21/02* | (2006.01) |
| *H01L 21/67* | (2006.01) |
| *F26B 3/04* | (2006.01) |
| *F26B 21/14* | (2006.01) |
| *F26B 9/06* | (2006.01) |

(52) U.S. Cl.
CPC .......... *H01L 21/02057* (2013.01); *F26B 3/04* (2013.01); *F26B 9/06* (2013.01); *F26B 21/14* (2013.01); *H01L 21/67028* (2013.01); *H01L 21/67034* (2013.01)

(58) Field of Classification Search
None
See application file for complete search history.

(56) References Cited

U.S. PATENT DOCUMENTS

| | | | | |
|---|---|---|---|---|
| 4,778,532 | A * | 10/1988 | McConnell | B05C 3/109 |
| | | | | 134/10 |
| 6,029,371 | A * | 2/2000 | Kamikawa | H01L 21/67034 |
| | | | | 34/516 |
| 8,039,179 | B2 | 10/2011 | Shieh et al. | |
| 8,202,681 | B2 | 6/2012 | Lin et al. | |
| 8,728,332 | B2 | 5/2014 | Lin et al. | |
| 8,822,343 | B2 | 9/2014 | Hsieh et al. | |
| 2002/0139389 | A1* | 10/2002 | Treur | H01L 21/67028 |
| | | | | 134/1.3 |
| 2005/0067001 | A1* | 3/2005 | Gast | B08B 3/102 |
| | | | | 134/25.1 |
| 2006/0091468 | A1 | 5/2006 | Liaw | |
| 2006/0272676 | A1* | 12/2006 | Iwase | H01L 21/02087 |
| | | | | 134/2 |

(Continued)

*Primary Examiner* — Eric W Golightly
*Assistant Examiner* — Arlyn I Rivera-Cordero
(74) *Attorney, Agent, or Firm* — Birch, Stewart, Kolasch & Birch, LLP (57) ABSTRACT

A method for drying a wafer is provided. The method includes providing or receiving the wafer and applying a rinsing liquid in a liquid state to the wafer. The rinsing liquid has a boiling point. The method also includes drying the wafer by applying a drying fluid in a gaseous state to the wafer. The drying fluid has a higher temperature than the boiling point of the rinsing liquid, and the rinsing liquid is evaporated and removed by the drying fluid. After the removal of the rinsing liquid, the drying fluid remains in a gaseous state.

20 Claims, 7 Drawing Sheets

(56) References Cited

U.S. PATENT DOCUMENTS

| | | | |
|---|---|---|---|
| 2008/0236634 A1* | 10/2008 | Moriya | H01L 21/67051 |
| | | | 134/95.3 |
| 2010/0200547 A1* | 8/2010 | Higashijima | H01L 21/67034 |
| | | | 216/92 |
| 2010/0223805 A1* | 9/2010 | Hyakutake | H01L 21/67028 |
| | | | 34/427 |
| 2011/0281208 A1 | 11/2011 | Lin et al. | |
| 2012/0234356 A1* | 9/2012 | Nishi | H01L 21/02052 |
| | | | 134/21 |
| 2012/0278776 A1 | 11/2012 | Lei et al. | |
| 2013/0295769 A1 | 11/2013 | Lin et al. | |
| 2013/0320451 A1 | 12/2013 | Liu et al. | |
| 2014/0193974 A1 | 7/2014 | Lee et al. | |
| 2014/0215421 A1 | 7/2014 | Chen et al. | |
| 2014/0242794 A1 | 8/2014 | Lin et al. | |
| 2014/0264760 A1 | 9/2014 | Chang et al. | |
| 2014/0264899 A1 | 9/2014 | Chang et al. | |
| 2014/0273442 A1 | 9/2014 | Liu et al. | |
| 2014/0273446 A1 | 9/2014 | Huang et al. | |
| 2015/0243495 A1* | 8/2015 | Chang | H01L 21/02052 |
| | | | 134/6 |

\* cited by examiner

METHOD FOR DRYING WAFER WITH GASEOUS FLUID

CROSS REFERENCE TO RELATED APPLICATIONS

This application claims the benefit of U.S. Provisional Application No. 62/426,877 filed on Nov. 28, 2016, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. These fabrication processes include photolithography processes, etching processes, cleaning processes, rinsing processes, drying processes, and the like. Therefore, it is a challenge to form reliable semiconductor device structures at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper", "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional elements can be added to the apparatus. Some of the elements of the apparatus described below can be replaced or eliminated for different embodiments. Although some embodiments are discussed with operations performed in a particular order, these operations may be performed in another logical order.

Figure 1:
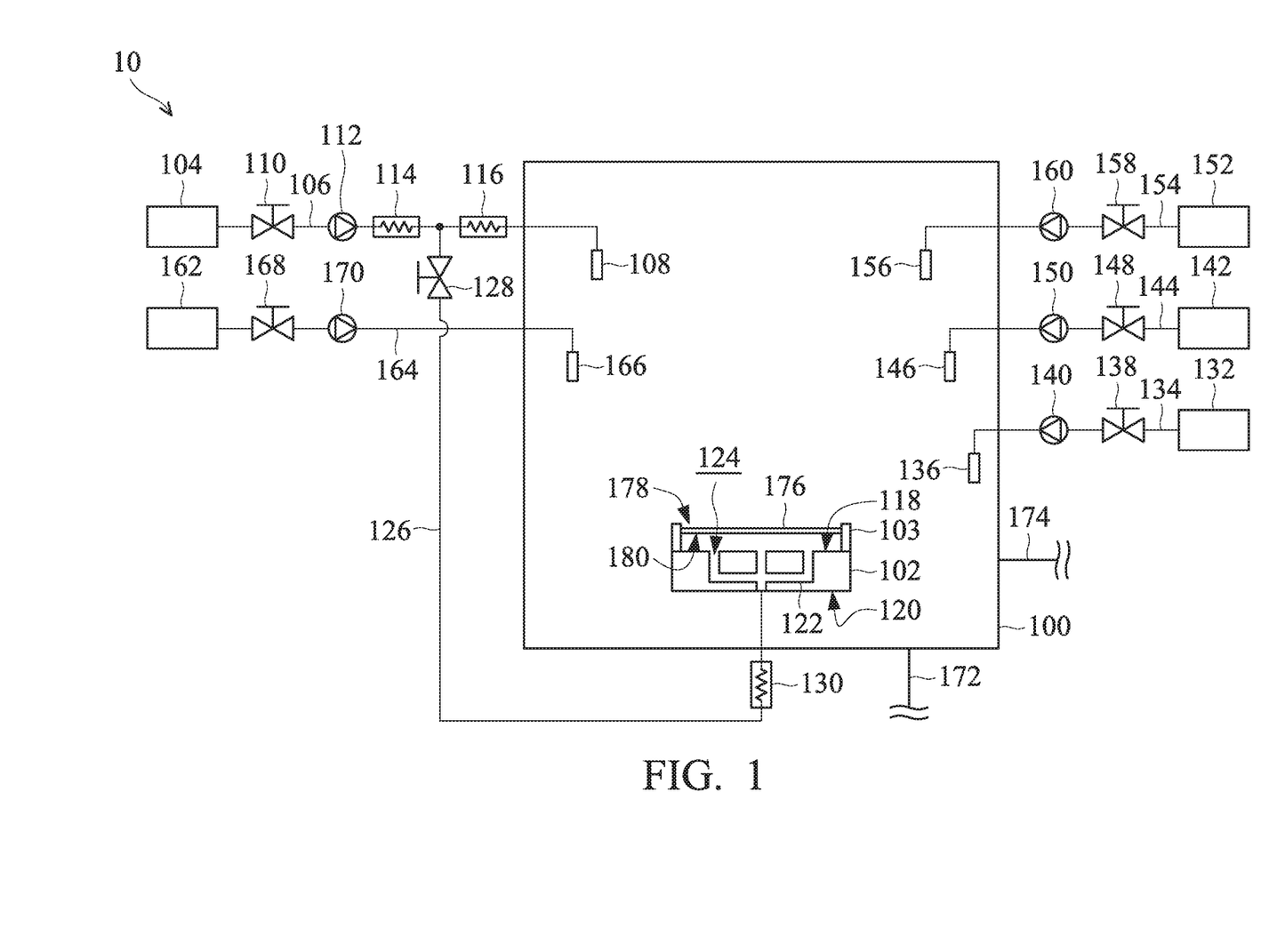
FIG. 1 shows a schematic view of an apparatus for processing a wafer, in accordance with some embodiments.

FIG. 1 shows a schematic view of an apparatus 10 for processing a wafer, in accordance with some embodiments. In some embodiments, the apparatus 10 is used for cleaning, rinsing and/or drying a wafer. As shown in FIG. 1, the apparatus 10 includes a process chamber 100, a base 102 in the process chamber 100, and a chuck 103 over the base 102, in accordance with some embodiments.

In some embodiments, the base 102 is positioned in an enclosed space defined by the process chamber 100. In some embodiments, the base 102 is configured for positioning, moving, and otherwise manipulating a wafer. In some embodiments, the base 102 is designed and configured to be operable for translational and rotational motions. In some embodiments, the base 102 is further designed to tilt or dynamically change the tilt angle. In some embodiments, base 102 is fitted with a suitable heating mechanism to heat a wafer positioned over the base 102 to a desired temperature. In some embodiments, the chuck 103 is configured for holding a wafer.

As shown in FIG. 1, the apparatus 10 further includes a container 104 and a pipe 106, in accordance with some embodiments. In some embodiments, the container 104 is used to store or contain a precursor fluid. In some embodiments, the pipe 106 is used to connect the container 104 to the process chamber 100. As shown in FIG. 1, one end of the pipe 106 is connected to the container 104, whereas the other end of the pipe 106 is connected to a nozzle 108 positioned in the process chamber 100, in accordance with some embodiments. In some embodiments, the nozzle 108 is placed on a movable stage that is able to move in the process chamber 100.

As shown in FIG. 1, the apparatus 10 further includes a valve 110 provided on the pipe 106, in accordance with some embodiments. In some embodiments, the valve 110 is used to regulate the flow of the fluid in the pipe 106. In some embodiments, the apparatus 10 further includes a host computer to control the valve 110 according to a predetermined setting. As shown in FIG. 1, the apparatus 10 further includes a pump 112 provided on the pipe 106, in accordance with some embodiments. In some embodiments, the pump 112 is used to pump the fluid in the pipe 106 from the container 104 to the nozzle 108.

As shown in FIG. 1, the apparatus 10 further includes a heating unit 114 provided on the pipe 106, in accordance with some embodiments. In some embodiments, the heating unit 114 is used to heat the fluid in the pipe 106 that flows through the heating unit 114. In some embodiments, the heating unit 114 includes a resistive heater, a heating tape, a microwave heater, another suitable heating unit, or a combination thereof.

As shown in FIG. 1, the apparatus 10 further includes another heating unit 116 provided on the pipe 106, in accordance with some embodiments. In some embodiments, the heating unit 116 is positioned closer to the process chamber 100 than the heating unit 114. In some embodiments, the heating unit 116 is used to heat the fluid in the pipe 106 that flows through the heating unit 116 so as to control the temperature of the fluid that is about to enter the process chamber 100. In some embodiments, the heating unit 116 includes a resistive heater, a heating tape, a microwave heater, another suitable heating unit, or a combination thereof.

However, the embodiments of the present disclosure are not limited thereto. In some other embodiments of the present disclosure, the apparatus 10 merely includes one heating unit (i.e. heating unit 114) provided on the pipe 106. In these embodiments, the apparatus 10 includes the heating unit 114 but does not include another heating unit provided on the pipe 106.

It should be noted that the positional sequence of the valve 110, pump 112, heating unit 114 and heating unit 116 provided on the pipe 106 is not limited by the embodiments. In some embodiments, as long as each of these elements is able to perform its function, the valve 110, pump 112, heating unit 114 and heating unit 116 can be provided on the pipe 106 in any other positional sequence.

As shown in FIG. 1, the base 102 includes a top surface 118, a bottom surface 120, and a gas passage 122 extending from the bottom surface 120 to the top surface 118, in accordance with some embodiments. As shown in FIG. 1, the gas passage 122 includes one or more openings 124 at the top surface 118 of the base 102.

As shown in FIG. 1, the apparatus 10 further includes a pipe 126 connecting the pipe 106 to the gas passage 122 of the base 102. As shown in FIG. 1, the apparatus 10 further includes a valve 128 provided on the pipe 126, in accordance with some embodiments. In some embodiments, the valve 128 is used to regulate the flow of the fluid in the pipe 126.

As shown in FIG. 1, the apparatus 10 further includes a heating unit 130 provided on the pipe 126, in accordance with some embodiments. In some embodiments, the heating unit 130 is positioned close to the process chamber 100. In some embodiments, the heating unit 130 is used to heat the fluid in the pipe 126 that flows through the heating unit 130 so as to control the temperature of the fluid that is about to enter the process chamber 100. In some embodiments, the heating unit 130 includes a resistive heater, a heating tape, a microwave heater, another suitable heating unit, or a combination thereof. However, in some other embodiments of the present disclosure, the apparatus 10 does not include a heating unit provided on the pipe 126.

As shown in FIG. 1, the apparatus 10 further includes a container 132 and a pipe 134, in accordance with some embodiments. In some embodiments, the container 132 is used to store or contain a cleaning liquid. In some embodiments, the pipe 134 is used to connect the container 132 to the process chamber 100. As shown in FIG. 1, one end of the pipe 134 is connected to the container 132, whereas the other end of the pipe 134 is connected to a nozzle 136 which is positioned in the process chamber 100, in accordance with some embodiments. In some embodiments, the nozzle 136 is placed on a movable stage that is able to move in the process chamber 100.

As shown in FIG. 1, the apparatus 10 further includes a valve 138 provided on the pipe 134, in accordance with some embodiments. In some embodiments, the valve 138 is used to regulate the flow of the fluid in the pipe 134. In some embodiments, the valve 138 is controlled by the host computer according to a predetermined setting. As shown in FIG. 1, the apparatus 10 further includes a pump 140 provided on the pipe 134, in accordance with some embodiments. In some embodiments, the pump 140 is used to pump the fluid in the pipe 134 from the container 132 to the nozzle 136.

It should be noted that the positional sequence of the valve 138 and pump 140 provided on the pipe 134 is not limited by the embodiments. In some embodiments, as long as each of these elements is able to perform its function, the valve 138 and pump 140 can be provided on the pipe 134 in any other positional sequence.

As shown in FIG. 1, the apparatus 10 further includes a container 142 and a pipe 144, in accordance with some embodiments. In some embodiments, the container 142 is used to store or contain a first rinsing liquid such as water. In some embodiments, the pipe 144 is used to connect the container 142 to the process chamber 100. As shown in FIG. 1, one end of the pipe 144 is connected to the container 142, whereas the other end of the pipe 144 is connected to a nozzle 146 which is positioned in the process chamber 100, in accordance with some embodiments. In some embodiments, the nozzle 146 is placed on a movable stage that is able to move in the process chamber 100.

As shown in FIG. 1, the apparatus 10 further includes a valve 148 provided on the pipe 144, in accordance with some embodiments. In some embodiments, the valve 148 is used to regulate the flow of the fluid in the pipe 144. In some embodiments, the valve 148 is controlled by the host computer according to a predetermined setting. As shown in FIG. 1, the apparatus 10 further includes a pump 150 provided on the pipe 144, in accordance with some embodiments. In some embodiments, the pump 150 is used to pump the fluid in the pipe 144 from the container 142 to the nozzle 146.

It should be noted that the positional sequence of the valve 148 and pump 150 provided on the pipe 144 is not limited by the embodiments. In some embodiments, as long as each of these elements is able to perform its function, the valve 148 and pump 150 can be provided on the pipe 144 in any other positional sequence.

As shown in FIG. 1, the apparatus 10 further includes a container 152 and a pipe 154, in accordance with some embodiments. In some embodiments, the container 152 is used to store or contain a second rinsing liquid such as isopropyl alcohol (IPA). In some embodiments, the pipe 154 is used to connect the container 152 to the process chamber 100. As shown in FIG. 1, one end of the pipe 154 is connected to the container 152, whereas the other end of the pipe 154 is connected to a nozzle 156 which is positioned in the process chamber 100, in accordance with some embodiments. In some embodiments, the nozzle 156 is placed on a movable stage that is able to move in the process chamber 100.

As shown in FIG. 1, the apparatus 10 further includes a valve 158 provided on the pipe 154, in accordance with some embodiments. In some embodiments, the valve 158 is used to regulate the flow of the fluid in the pipe 154. In some embodiments, the valve 158 is controlled by the host computer according to a predetermined setting. As shown in FIG. 1, the apparatus 10 further includes a pump 160 provided on the pipe 154, in accordance with some embodiments. In some embodiments, the pump 160 is used to pump the fluid in the pipe 154 from the container 152 to the nozzle 156.

It should be noted that the positional sequence of the valve 158 and pump 160 provided on the pipe 154 is not limited by the embodiments. In some embodiments, as long as each of these elements is able to perform its function, the valve 158 and pump 160 can be provided on the pipe 154 in any other positional sequence.

As shown in FIG. 1, the apparatus 10 further includes a container 162 and a pipe 164, in accordance with some embodiments. In some embodiments, the container 162 is used to store or contain an additional gas. In some embodiments, the pipe 164 is used to connect the container 162 to the process chamber 100. As shown in FIG. 1, one end of the pipe 164 is connected to the container 162, whereas the other end of the pipe 164 is connected to a nozzle 166 which is positioned in the process chamber 100, in accordance with some embodiments. In some embodiments, the nozzle 166 is placed on a movable stage that is able to move in the process chamber 100.

As shown in FIG. 1, the apparatus 10 further includes a valve 168 provided on the pipe 164, in accordance with some embodiments. In some embodiments, the valve 168 is used to regulate the flow of the fluid in the pipe 164. In some embodiments, the valve 168 is controlled by the host computer according to a predetermined setting. As shown in FIG. 1, the apparatus 10 further includes a pump 170 provided on the pipe 164, in accordance with some embodiments. In some embodiments, the pump 170 is used to pump the fluid in the pipe 164 from the container 162 to the nozzle 166.

It should be noted that the positional sequence of the valve 168 and pump 170 provided on the pipe 164 is not limited by the embodiments. In some embodiments, as long as each of these elements is able to perform its function, the valve 168 and pump 170 can be provided on the pipe 164 in any other positional sequence.

However, the embodiments of the present disclosure are not limited thereto. In some other embodiments, the apparatus 10 does not include the container 162, the pipe 164, the nozzle 166, the valve 168 and the pump 170.

In some embodiments, the apparatus 10 further includes an outlet 172 connected to a liquid process system (not shown in figures) to discharge waste liquid fluid such as the cleaning liquid, the first rinsing liquid, and the second rinsing liquid from the process chamber 100. In some embodiments, the apparatus 10 further includes an outlet 174 connected to a gas process system (not shown in figures) to discharge waste gaseous fluid such as the subsequent drying fluid, and the additional gas from the process chamber 100.

It should be noted that additional elements can be added to the apparatus. Some of the elements of the apparatus described above can be replaced or eliminated for different embodiments.

FIGS. 1 and 2A-2D are cross-sectional views of various stages of a cleaning and/or drying process for processing a wafer, in accordance with some embodiments. As shown in FIG. 1, a wafer 176 is provided or received, in accordance with some embodiments. As shown in FIG. 1, the wafer 176 is positioned over the base 102, and is held by the chuck 103, in accordance with some embodiments. As shown in FIG. 1, the wafer 176 has a top surface 178 and a bottom surface 180 opposite to the top surface 178, in accordance with some embodiments. As shown in FIG. 1, the bottom surface 180 of the wafer 176 faces the base 102 and/or the openings 124 of the gas passage 122, in accordance with some embodiments.

Figure 2A:
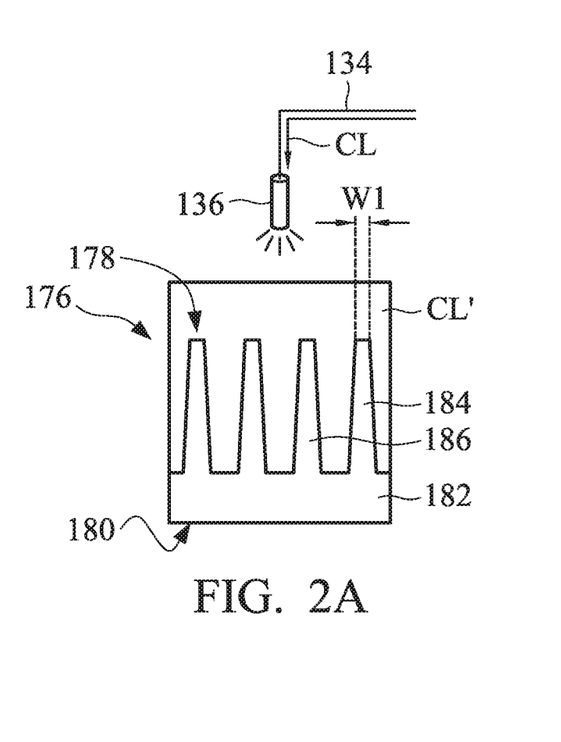
FIGS. 2A-2D are cross-sectional views of various stages of a process for processing a wafer, in accordance with some embodiments.

FIG. 2A is an enlarged view of the wafer 176 and the nozzle 136 in FIG. 1 in accordance with some embodiments. As shown in FIG. 2A, the wafer 176 includes a substrate 182, in accordance with some embodiments. In some embodiments, the substrate 182 is a bulk semiconductor substrate. For example, the substrate 182 is a silicon substrate. The substrate 182 may include silicon or another elementary semiconductor material such as germanium. In some other embodiments, the substrate 182 includes a compound semiconductor. The compound semiconductor may include gallium arsenide, silicon carbide, indium arsenide, indium phosphide, another suitable material, or a combination thereof.

In some embodiments, the substrate 182 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the substrate 182 is an un-doped substrate. However, in some other embodiments, the substrate 182 includes various doped regions (not shown) depending on design requirements of the semiconductor device structure. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

As shown in FIG. 2A, the wafer 176 includes two or more features over the substrate 182, in accordance with some embodiments. In some embodiments the wafer 176 includes the feature 184 and the feature 186 which are adjacent to each other as shown in FIG. 2A. In some embodiments, features such as features 184 and 186 are made of silicon. Features such as features 184 and 186 may include silicon or another elementary semiconductor material such as germanium. In some other embodiments, features such as features 184 and 186 include a compound semiconductor. The compound semiconductor may include gallium arsenide, silicon carbide, indium arsenide, indium phosphide, another suitable material, or a combination thereof. In some other embodiments, the features are made of polysilicon. In some other embodiments, the features are made of dielectric material such as silicon oxide, silicon nitride, silicon oxynitride.

In some embodiments, one or more features such as features 184 and 186 have an aspect ratio in a range from about 6 to about 100, for example from about 12 to about 50. In some embodiments, the top surface of one or more features such as features 184 and 186 have a width such as the width W1 in a range from about 7 nm to about 50 nm, for example from about 10 nm to about 20 nm.

In some embodiments, a cleaning liquid CL is stored or contained in the container 132 as shown in FIG. 1. In some embodiments, the nozzle 136 is placed on a movable stage that is able to scan across the surface of the wafer 176. As shown in FIG. 2A, the nozzle 136 is moved to a position over the wafer 176, in accordance with some embodiments. As shown in FIG. 2A, the nozzle 136 is positioned relative to the top surface 178 of the wafer 176 so as to allow the cleaning liquid CL to be sprayed from the nozzle 136 onto the top surface 178 of the wafer 176, in accordance with some embodiments.

Afterward, in some embodiments, the valve 138 is opened, and the pump 140 pumps the cleaning liquid CL in the container 132 to the nozzle 136 through the pipe 134. Thereby, as shown in FIG. 2A, the cleaning liquid CL is sprayed and applied onto the top surface 178 of the wafer 176, in accordance with some embodiments.

In some embodiments, the cleaning liquid CL includes an aqueous acidic solution, an aqueous basic solution, or a mixture of $H_2O_2$ and the aqueous acidic solution, or a mixture of $H_2O_2$ and the aqueous basic solution.

In some embodiments, the cleaning liquid CL is a SC1/APM solution mixed with substances including $NH_4OH$, $H_2O_2$, and $H_2O_2$ in a selected ratio. The SC1/APM solution may be used to clean the wafer and to remove the organic compound and particulate matter that attaches to the substrate surface. Alternatively, the cleaning liquid CL may be a SC2/HPM solution, mixed with a substance including HCl, $H_2O_2$, and $H_2O$ in a selected ratio. The SC2/HPM solution may be used to clean the wafer and to remove the metal dregs that attach to the wafer surface. However, it should be appreciated that many variations and modifications can be made to embodiments of the disclosure.

As shown in FIG. 2A, after the application of the cleaning liquid CL, a portion CL' of the cleaning liquid CL remains over the wafer 176, in accordance with some embodiments. As shown in FIG. 2A, the remaining portion CL' of the cleaning liquid CL is positioned between features such as feature 184 and feature 186 and covers the top surfaces of the features, in accordance with some embodiments. However, in some other embodiments of the present disclosure, the remaining portion CL' of the cleaning liquid CL surrounds the lower portion of the features, and exposes the top portion of the features. In these embodiments, the features protrude from the top surface of the remaining portion CL' of the cleaning liquid CL, and the top surfaces of the features are not covered by the remaining portion CL' of the cleaning liquid CL.

In some embodiments, after the application of the cleaning liquid CL, the nozzle 136 is moved away from the wafer 176.

Figure 2B:
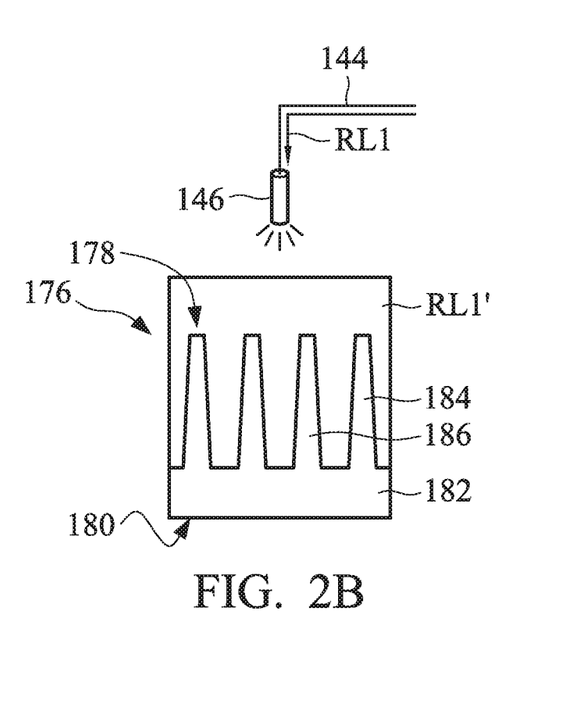

As shown in FIG. 1, in some embodiments, a first rinsing liquid RL1 in a liquid state is stored or contained in the container 142. In some embodiments, the nozzle 146 is placed on a movable stage that is able to scan across the surface of the wafer 176. FIG. 2B is an enlarged view of the wafer 176 and the nozzle 146 in FIG. 1 in accordance with some embodiments. As shown in FIG. 2B, the nozzle 146 is moved to a position over the wafer 176, in accordance with some embodiments. As shown in FIG. 2B, the nozzle 146 is positioned relative to the top surface 178 of the wafer 176 so as to allow the first rinsing liquid RL1 to be sprayed from the nozzle 146 onto the top surface 178 of the wafer 176, in accordance with some embodiments.

Afterward, in some embodiments, the valve 148 is opened, and the pump 150 pumps the first rinsing liquid RL1 in the container 142 to the nozzle 146 through the pipe 144. Thereby, as shown in FIG. 2B, the first rinsing liquid RL1 in a liquid state is sprayed and applied onto the top surface 178 of the wafer 176, in accordance with some embodiments. In some embodiments, the portion CL' of the cleaning liquid CL is removed by the application of the first rinsing liquid RL1.

In some embodiments, the first rinsing liquid RL1 has a first boiling point. In some embodiments, the first rinsing liquid RL1 is water, such as deionized water (DIW).

As shown in FIG. 2B, after the application of the first rinsing liquid RL1, a portion RL1' of the first rinsing liquid RL1 remains over the wafer 176, in accordance with some embodiments. As shown in FIG. 2B, the remaining portion RL1' of the first rinsing liquid RL1 is positioned between the features such as feature 184 and feature 186 and covers the top surfaces of the features, in accordance with some embodiments. However, in some other embodiments of the present disclosure, the remaining portion RL1' of the first rinsing liquid RL1 surrounds the lower portion of the features, and exposes the top portion of the features. In these embodiments, the features protrude from the top surface of the remaining portion RL1' of the first rinsing liquid RL1, and the top surfaces of the features are not covered by the remaining portion RL1' of the first rinsing liquid RL1.

In some embodiments, after the application of the first rinsing liquid RL1, the nozzle 146 is moved away from the wafer 176.

Figure 2C:
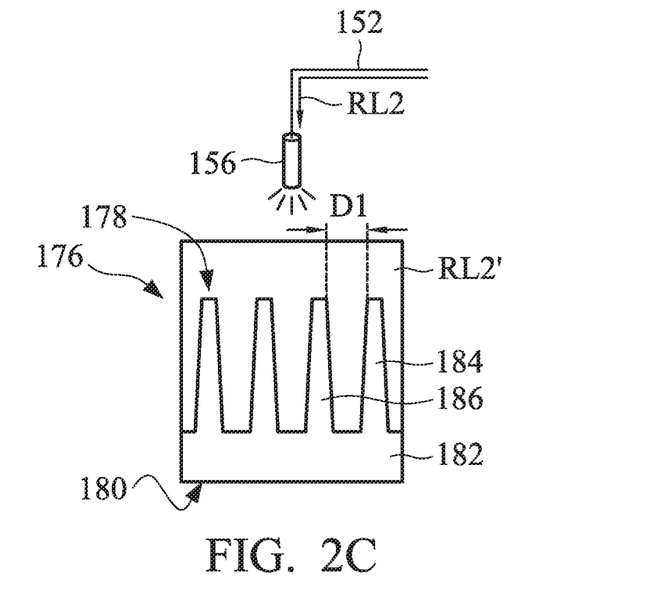

As shown in FIG. 1, in some embodiments, a second rinsing liquid RL2 in a liquid state is stored or contained in the container 152. In some embodiments, the nozzle 156 is placed on a movable stage that is able to scan across the surface of the wafer 176. FIG. 2C is an enlarged view of the wafer 176 and the nozzle 156 in FIG. 1 in accordance with some embodiments. As shown in FIG. 2C, the nozzle 156 is moved to a position over the wafer 176, in accordance with some embodiments. As shown in FIG. 2C, the nozzle 156 is positioned relative to the top surface 178 of the wafer 176 so as to allow the second rinsing liquid RL2 to be sprayed from the nozzle 156 onto the top surface 178 of the wafer 176, in accordance with some embodiments.

Afterward, in some embodiments, the valve 158 is opened, and the pump 160 pumps the second rinsing liquid RL2 in the container 152 to the nozzle 156 through the pipe 154. Thereby, as shown in FIG. 2C, the second rinsing liquid RL2 in a liquid state is sprayed and applied onto the top surface 178 of the wafer 176, in accordance with some embodiments. In some embodiments, the portion RL1' of the first rinsing liquid RL1 is removed by the application of the second rinsing liquid RL2.

In some embodiments, the second rinsing liquid RL2 has a second boiling point. In some embodiments, the second rinsing liquid RL2 is isopropyl alcohol (IPA).

As shown in FIG. 2C, after the application of the second rinsing liquid RL2, a portion RL2' of the second rinsing liquid RL2 remains over the wafer 176, in accordance with some embodiments. As shown in FIG. 2C, the remaining portion RL2' of the second rinsing liquid RL2 is positioned between features such as feature 184 and feature 186 and covers the top surfaces of the features, in accordance with some embodiments. However, in some other embodiments of the present disclosure, the remaining portion RL2' of the second rinsing liquid RL2 surrounds the lower portion of the features, and exposes the top portion of the features. In these embodiments, the features protrude from the top surface of the remaining portion RL2' of the second rinsing liquid RL2, and the top surfaces of the features are not covered by the remaining portion RL2' of the second rinsing liquid RL2.

In some embodiments, after the application of the second rinsing liquid RL2, the nozzle 156 is moved away from the wafer 176.

Figure 2D:
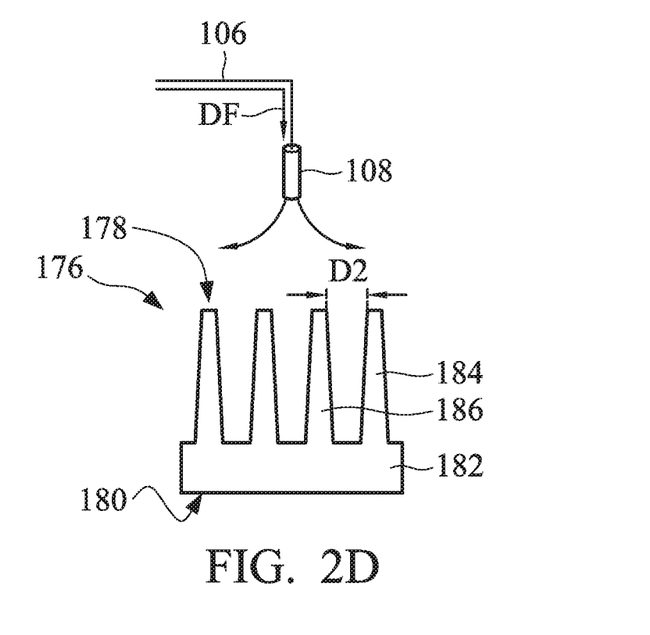

FIG. 2D is an enlarged view of the wafer 176 and the nozzle 108 in FIG. 1 in accordance with some embodiments. As shown in FIG. 2D, the nozzle 108 is moved to a position over the wafer 176, in accordance with some embodiments. As shown in FIG. 2D, the nozzle 108 is positioned relative to the top surface 178 of the wafer 176 so as to allow a drying fluid DF in a gaseous state to be sprayed from the nozzle 108 onto the top surface 178 of the wafer 176, in accordance with some embodiments.

As shown in FIG. 2D, the wafer 176 is dried by applying the drying fluid DF in a gaseous state to the wafer 176, in accordance with some embodiments. In some embodiments, the drying fluid DF in a gaseous state has a first temperature that is higher than the second boiling point of the second rinsing liquid RL2. In some embodiments, the remaining portion RL2' of the second rinsing liquid RL2 is heated and evaporated by the drying fluid DF. Therefore, as shown in FIG. 2D, the remaining portion RL2' of the second rinsing liquid RL2 is evaporated and removed by the drying fluid DF, in accordance with some embodiments.

In some embodiments, after the removal of the remaining portion RL2' of the second rinsing liquid RL2, the drying fluid DF remains in a gaseous state and has a higher temperature than the boiling point of the drying fluid.

In some embodiments, the drying fluid DF includes superheated water (or alternatively named superheated steam), $CO_2$, $N_2$, He, Ne, Ar, Kr, or a combination thereof. In some embodiments, the drying fluid DF is referred to as a heated gas.

It should be noted that the apparatus and the method are not limited by the embodiments. In some embodiments, the apparatus 10 does not include the container 152 used to store the second rinsing liquid RL2 such as IPA, the pipe 154, the nozzle 156, the valve 158 and the pump 160. In some embodiments, the method for cleaning and/or drying the wafer 176 does not include applying the second rinsing liquid RL2 such as IPA. In these embodiments, the first rinsing liquid RL1, such as DIW, is directly removed by the application of the drying fluid DF in a gaseous state as shown in FIG. 2D.

In some embodiments, the drying fluid DF in a gaseous state has a first temperature that is higher than the first boiling point of the first rinsing liquid RL1. In some embodiments, the remaining portion RL1' of the first rinsing liquid RL1 shown in FIG. 2B is heated and evaporated by the drying fluid DF. Therefore, as shown in FIG. 2D, the remaining portion RL1' of the first rinsing liquid RL1 is directly evaporated and removed by the drying fluid DF, in accordance with some embodiments.

In some other embodiments of the present disclosure, the apparatus 10 does not include the container 142 used to store the first rinsing liquid RL1 such as DIW, the pipe 144, the nozzle 146, the valve 148 and the pump 150. In some embodiments, the method for cleaning and/or drying the wafer 176 does not include applying the first rinsing liquid RL1 such as DIW. In these embodiments, the remaining portion CL' of the cleaning liquid CL shown in FIG. 2A is directly removed by the application of the second rinsing liquid RL2 as shown in FIG. 2C.

In some embodiments, the viscosity of the gaseous drying fluid DF is less than the viscosity of the liquid first rinsing liquid RL1 and/or the liquid second rinsing liquid RL2. In some embodiments, the surface tension of the drying fluid is in a range from about 0 mN/m to about 1 mN/m, for example from about 0.0001 mN/m to about 0.001 mN/m.

In some embodiments, since the drying fluid substantially and effectively removes the remaining portion of the rinsing liquid, the wafer is effectively dried by the drying fluid. In some embodiments, the drying process of the present disclosure reduces or prevents the formation of a water mark. In some embodiments, since the drying fluid substantially and effectively removes the remaining portion of the rinsing liquid, the spin rate of the wafer can be decreased during the drying process. In some embodiments, during the drying process, the wafer does not need to be spun since the remaining portion of the rinsing liquid is substantially removed by the drying fluid.

In some embodiments, since the wafer is not spun or is spun by spinning the base 102 at a low spin rate, the features of the wafer would not collapse during the drying process. In some embodiments, as shown in FIG. 2C, before the removal of the first rinsing liquid RL1 and/or the second rinsing liquid RL2, the feature 180 and the feature 182 are spaced apart from each other by a first distance D1. As shown in FIG. 2D, after the removal of the first rinsing liquid RL1 and/or the second rinsing liquid RL2, the feature 180 and the feature 182 are spaced apart from each other by a second distance D2, in accordance with some embodiments. In some embodiments, the second distance D2 is substantially equal to the first distance D1 since the features do not collapse during the drying process.

In some embodiments, the first distance D1 is the shortest distance between the top surface of the feature 180 and the top surface of the feature 182 before the removal of the first rinsing liquid RL1 and/or the second rinsing liquid RL2. In some embodiments, the second distance D2 is the shortest distance between the top surface of the feature 180 and the top surface of the feature 182 after the removal of the first rinsing liquid RL1 and/or the second rinsing liquid RL2.

In some embodiments, the first temperature of the drying fluid DF in a gaseous state is in a range from about 101° C. to about 250° C., for example, from about 150° C. to about 200° C. In some embodiments, the temperature of the process chamber 100 is at room temperature which is lower than the first temperature of the drying fluid DF.

In some cases, if the first temperature of the drying fluid DF is too high, for example higher than 250'C, the device and/or structure in the wafer 176 would be damaged. However, in some cases, if the first temperature of the drying fluid DF is too low, for example lower than 101° C., the rinsing liquid may not be removed effectively, and the wafer 176 may not be dried effectively.

In some embodiments, the flow rate of the drying fluid DF is in a range from about 1 standard liters per minute (slm) to about 1000 slm, for example, from about 200 slm to about 300 slm. In some cases, if the flow rate of the drying fluid DF is too high, for example, higher than 1000 slm, the wafer may be overheated and the device and/or structure in the wafer 176 would be damaged. However, in some cases, if the flow rate of the drying fluid DF is too low, for example, lower than 1 slm, the rinsing liquid may not be heated and removed effectively, and the wafer 176 may not be dried effectively.

In some embodiments, the heat capacity of the drying fluid DF is in a range from about 1 $J*g^{-1}*K^{-1}$ to about 5 $J*g^{-1}*K^{-1}$, for example, from about 2 $J*g^{-1}*K^{-1}$ to about 2.5 $J*g^{-1}*K^{-1}$. In some cases, if the heat capacity of the drying fluid DF is too high, for example higher than 5 $J*g^{-1}*K^{-1}$, the wafer may be overheated and the device and/or structure in the wafer 176 would be damaged. However, in some cases, if the heat capacity of the drying fluid DF is too low, for example lower than 1 $J*g^{-1}*K^{-1}$, the rinsing liquid may not be heated and removed effectively, and the wafer 176 may not be dried effectively.

In some embodiments, the drying fluid DF is formed and applied by the following method. In some embodiments, a precursor fluid PF is provided and is stored in the container 104 shown in FIG. 1. In some embodiments, the precursor fluid PF has a second temperature that is lower than the first temperature. In some embodiments, the precursor fluid PF is preheated to the second temperature in the container 104. In some embodiments, the second temperature is in a range from about 90° C. to about 100° C., for example from about 95° C. to about 99° C.

In some embodiments, the precursor fluid PF includes a liquid precursor fluid and/or a gaseous precursor fluid. In some embodiments, the liquid precursor fluid includes liquid water such as deionized water (DIW), or another suitable liquid precursor fluid. In some embodiments, the gaseous precursor fluid includes $CO_2$, $N_2$, He, Ne, Ar, Kr, another suitable gaseous precursor fluid, or a combination thereof.

Afterward, the valve 110 is opened and the pump 112 pumps the precursor fluid PF from the container 104 into the pipe 106. Thereby, the precursor fluid PF is supplied into the pipe 106. In some embodiments, while the precursor fluid PF flows through the heating unit 114, the precursor fluid PF is heated by the heating unit 114 and is transferred to the drying fluid DF having the first temperature. In some embodiments, the first temperature of the drying fluid DF is higher than the first boiling point of the first rinsing liquid RL1 and/or the second boiling point of the second rinsing liquid RL2.

In some embodiments, the precursor fluid PF is liquid water. In some embodiments, while the liquid water flows through the heating unit 114, the liquid water is heated by the heating unit 114 and is transferred to the superheated steam (or superheated water) in a gaseous state which has a first temperature that is higher than the boiling point of the liquid water.

In some embodiments, the precursor fluid PF is the gaseous precursor fluid with the second temperature mentioned above. In some embodiments, while the gaseous precursor fluid flows through the heating unit 114, the gaseous precursor fluid is heated by the heating unit 114 and becomes the drying fluid DF in a gaseous state which has a first temperature that is higher than the second temperature of the precursor fluid PF.

In some embodiments, after the drying fluid DF is formed, the drying fluid DF is pumped from the pipe 106 to the nozzle 108 by the operation of the pump 112. Afterward, the drying fluid DF is applied to the wafer 176 in the process chamber 100 to dry the wafer 176.

In some embodiments, the heating unit 116 is used to heat the drying fluid DF so as to control the temperature of the drying fluid DF that is about to enter the process chamber 100.

In some other embodiments of the present disclosure, the drying fluid DF is formed and applied by another method described below. In some embodiments, the container 104 and the pipe 106 are at a first pressure, and the precursor fluid PF has a third boiling point at the first pressure. In some embodiments, the process chamber 100 has a second pressure that is lower than the first pressure, and the precursor fluid PF has a fourth boiling point at the second pressure. In some embodiments, the fourth boiling point is lower than the third boiling point.

In some embodiments, the precursor fluid PF is supplied from the container 104 into the pipe 106 shown in FIG. 1. In some embodiments, the precursor fluid PF has the third boiling point in the pipe 106 having the first pressure. In some embodiments, while the precursor fluid PF flows through the heating unit 114, the precursor fluid PF is heated by the heating unit 114 to the first temperature. In some embodiments of the present disclosure, the first temperature is lower than the third boiling point but higher than the fourth boiling point.

Afterward, in some embodiments, the heated precursor fluid PF is supplied from the pipe 106 into the process chamber 100. In some embodiments, after the heated precursor fluid PF enters the process chamber 100 having the second pressure which is lower than the first pressure in the pipe 106, the heated precursor fluid PF has the fourth boiling point. In some embodiments, the fourth boiling point is lower than the first temperature of the heated precursor fluid PF. Therefore, the heated precursor fluid PF is evaporated and is transferred to the drying fluid DF when it enters the process chamber 100.

In some embodiments, the heating unit 116 is used to heat the heated precursor fluid PF so as to control the temperature of the heated precursor fluid PF that is about to enter the process chamber 100.

Figure 3A:
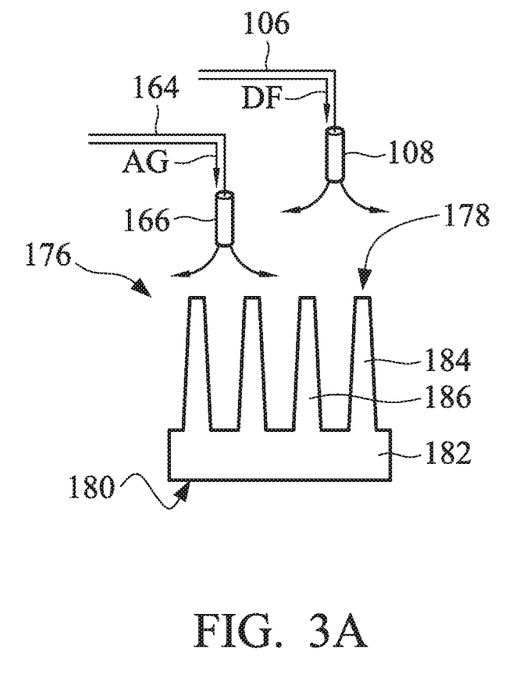
FIG. 3A is a cross-sectional view of a wafer in one stage of a manufacturing process according with some other embodiments.

In some embodiments, as shown in FIG. 3A, during application of the drying fluid DF, an additional gas AG is also applied to the wafer 176. In some embodiments, the additional gas AG has a first density, the drying fluid DF has a second density, and the first density is greater than the second density. In some embodiments, the additional gas AG includes air (such as clean dry air), $CO_2$, $N_2$. He, Ne, Ar, Kr, or a combination thereof.

In some embodiments, since the additional gas AG has a higher density than the drying fluid DF, the additional gas AG flows closer to the top surface 178 of the wafer 176 than the drying fluid DF. Therefore, the drying fluid DF may be lifted up by the additional gas AG. Thereby, the condensation of the drying fluid DF and the formation of liquid droplets due to condensation may be prevented. Therefore, the efficiency of the drying process may be improved.

In some embodiments, the first density of the additional gas AG is about 1.1 to 5 times the second density of the drying fluid DF. In some cases, if the first density of the additional gas AG is too low, for example lower than 1.1 times the second density, the drying fluid DF cannot be lifted up effectively. However, in some cases, if the first density of the additional gas AG is too great, for example greater than 5 times the second density, the drying fluid DF cannot effectively heat and evaporate the first rinsing liquid RL1 and/or the second rinsing liquid RL2.

In some embodiments, the first density of the additional gas AG is in a range from about 1 $kg/m^3$ to about 5 $kg/m^3$, for example from about 2 $kg/m^3$ to about 4 $kg/m^3$. In some embodiments, the second density of the drying fluid DF is in a range from about 0.5 $kg/m^3$ to about 4 $kg/m^3$, for example from about 1 $kg/m^3$ to about 2 $kg/m^3$.

As shown in FIGS. 1 and 3A, an additional gas AG is stored or contained in the container 162. In some embodiments, the nozzle 166 is placed on a movable stage that is able to scan across the surface of the wafer 176. As shown in FIG. 3A, the nozzle 166 is moved to a position over the wafer 176, in accordance with some embodiments. As shown in FIG. 3A, the nozzle 166 is positioned relative to the top surface 178 of the wafer 176 so as to allow the additional gas AG to be applied from the nozzle 166 onto the top surface 178 of the wafer 176, in accordance with some embodiments.

Afterward, in some embodiments, the valve 168 is opened, and the pump 170 pumps the additional gas AG in the container 162 to the nozzle 166 through the pipe 164. Thereby, as shown in FIG. 3A, the additional gas AG is applied onto the top surface 178 of the wafer 176, in accordance with some embodiments.

In some embodiments, the nozzle 166, which is used to apply the additional gas AG, is positioned closer to the top surface 178 of the wafer 176 than the nozzle 108, which is used to apply the drying fluid DF.

Figure 3B:
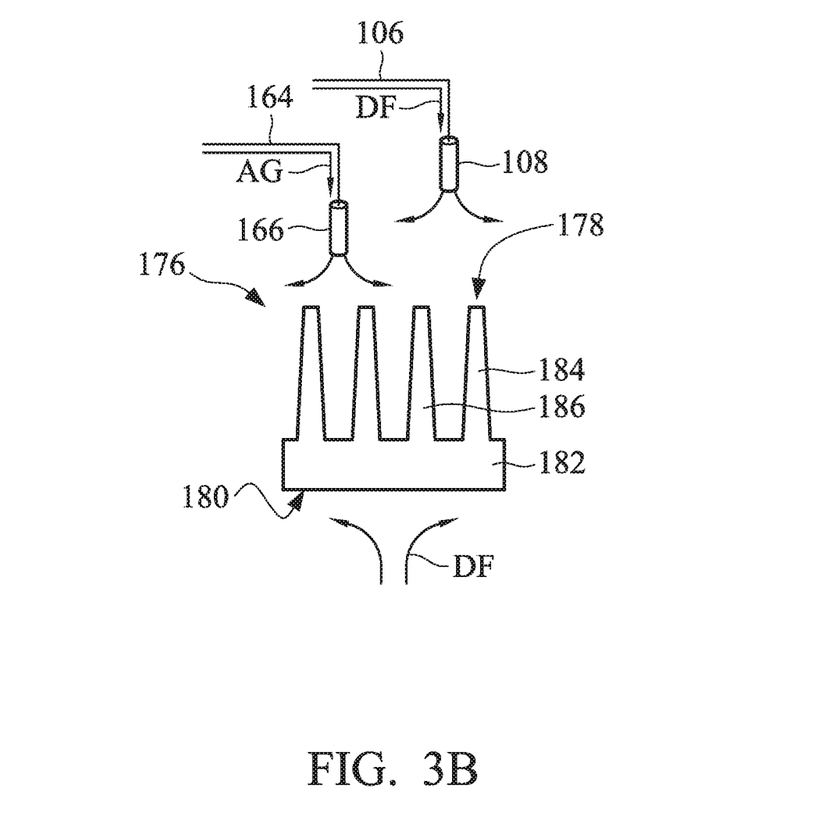
FIG. 3B is a cross-sectional view of a wafer in one stage of a manufacturing process according with some other embodiments.

As shown in FIG. 3B, the drying fluid DF is not only applied to the top surface 178 of the wafer 176, but it is also applied to the bottom surface 180 of the wafer 176. In some embodiments, during application of the drying fluid DF, the valve 128 in FIG. 1 is opened, and a portion of the drying fluid DF in the pipe 106 flows into the pipe 126, in accordance with some embodiments. As shown in FIGS. 1 and 3B, a portion of the drying fluid DF is applied from the heating unit 114 to the bottom surface 180 of the wafer 176 through the pipe 126 and the gas passage 122 of the base 102. In some embodiments, the heating unit 130 is used to control the temperature of the drying fluid DF that is about to enter the process chamber 100.

Figure 4:
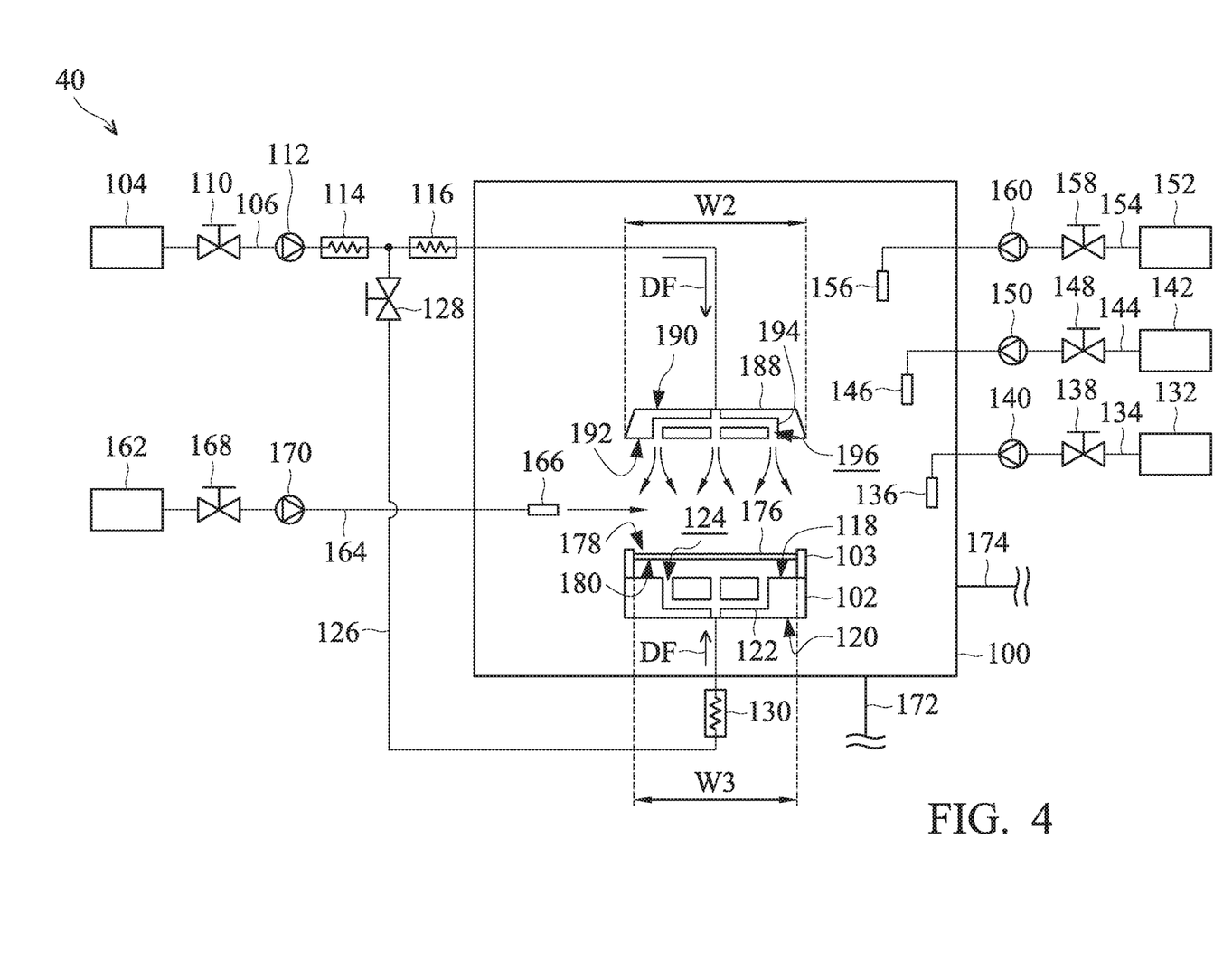
FIG. 4 shows a schematic view of an apparatus for processing a wafer, in accordance with some other embodiments.

FIG. 4 shows a schematic view of an apparatus 40 for processing a wafer, in accordance with some other embodiments. As shown in FIG. 4, one end of the pipe 106 is connected to the container 104, whereas the other end of the pipe 106 is connected to a dispensing head 188 in the process chamber 100, in accordance with some embodiments. In some embodiments, the dispensing head 188 has a top surface 190 and a bottom surface 192 opposite to the top surface 190, in accordance with some embodiments. As shown in FIG. 4, the bottom surface 192 faces the base 102 and/or the wafer 176, in accordance with some embodiments.

As shown in FIG. 4, the dispensing head 188 includes a gas passage 194 extending from the top surface 190 to the bottom surface 192, in accordance with some embodiments. As shown in FIG. 4, the gas passage 194 includes one or more openings 196 at the bottom surface 192 of the dispensing head 188. In some embodiments, the drying fluid DF is applied to the top surface 178 of the wafer 176 through the pipe 106 and the gas passage 194. In some embodiments of the present disclosure, during application of the drying fluid DF, the additional gas AG is applied laterally as shown in FIG. 4.

In some embodiments, the dispensing head 188 has a width W2, and the wafer 176 has a width W3. In some embodiments, the width W2 is greater than the width W3. In some embodiments, the width W3 is the shortest distance between two opposite inner sidewalls of the chuck 103. In some embodiments, the dispensing head 188 has a first area, and the wafer 176 has a second area. In some embodiments, the first area is greater than the second area.

In some embodiments, since the width and/or area of the dispensing head 188 is greater than that of the wafer 176, the drying fluid DF is applied to the entire top surface 178 of the wafer 176 uniformly, and the wafer 176 can be dried more efficiently.

It should be noted that the number and the distribution of the openings 196 of the dispensing head 188 is not limited by the embodiments. In some other embodiments, the dispensing head 188 has more or fewer openings 196, and the openings 196 may be distributed in another configuration.

Figure 5:
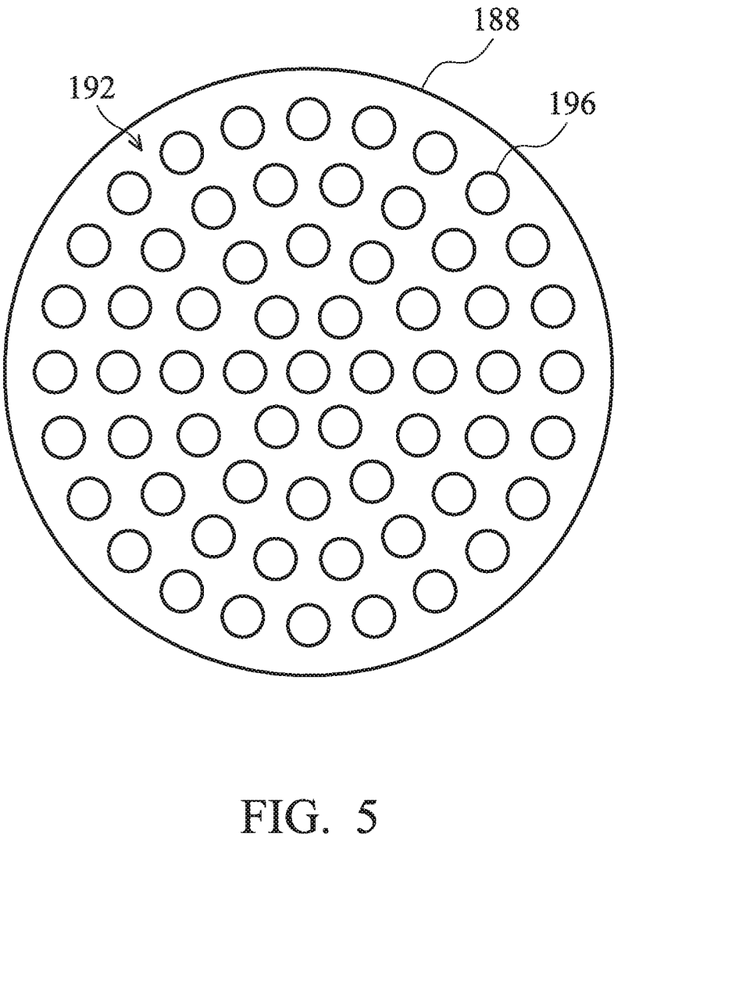
FIG. 5 shows a bottom view of a dispensing head in accordance with some embodiments.

FIG. 5 is a bottom view of the dispensing head 188 in accordance with some embodiments. As shown in FIG. 5, many openings 196 are uniformly distributed over the bottom surface 192 of the dispensing head 188.

In some embodiments, since the drying fluid effectively and substantially removes the remaining portion of the rinsing liquid, the wafer is effectively dried by the drying fluid. In some embodiments, the drying process of the present disclosure reduces or prevents the formation of a water mark. In some embodiments, since the drying fluid substantially and effectively removes the remaining portion of the rinsing liquid, the spin rate of the wafer may be decreased during the drying process. In some embodiments, during the drying process, the wafer does not need to be spun since the remaining portion of the rinsing liquid is substantially removed by the drying fluid. In some embodiments, since the wafer is not spun or is spun by spinning the base at a low spin rate, the features of the wafer do not collapse during the drying process.

In accordance with some embodiments, a method for drying a wafer is provided. The method includes providing or receiving the wafer and applying a rinsing liquid in a liquid state to the wafer. The rinsing liquid has a boiling point. The method also includes drying the wafer by applying a drying fluid in a gaseous state to the wafer. The drying fluid has a higher temperature than the boiling point of the rinsing liquid, and the rinsing liquid is evaporated and removed by the drying fluid. After the removal of the rinsing liquid, the drying fluid remains in a gaseous state.

In accordance with some embodiments, a method for drying a wafer is provided. The method includes providing an apparatus. The apparatus includes a chamber, a base in the chamber, and a chuck over the base. The method also includes positioning a wafer over the base. The wafer is held by the chuck. The method further includes applying a cleaning liquid to the wafer, removing the cleaning liquid by applying a rinsing liquid to the wafer. The rinsing liquid has a first boiling point. The method also includes removing the rinsing liquid by heating and evaporating the rinsing liquid by applying a drying fluid to the wafer. The drying fluid has a first temperature that is higher than the first boiling point of the rinsing liquid.

In accordance with some embodiments, a method for drying a wafer is provided. The method includes providing or receiving the wafer, and applying a cleaning liquid to the wafer. After the application of the cleaning liquid, a portion of the cleaning liquid remains over the wafer. The method also includes removing the portion of the cleaning liquid by applying a rinsing liquid to the wafer. After the application of the rinsing liquid, a portion of the rinsing liquid remains over the wafer. The rinsing liquid has a boiling point. The method further includes removing the portion of the rinsing liquid by applying drying fluid in a gaseous state to the wafer. The drying fluid has a higher temperature than the boiling point of the rinsing liquid, and the rinsing liquid is evaporated and removed by the drying fluid. After the removal of the rinsing liquid, the drying fluid remains in a gaseous state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for drying a wafer, comprising:
   providing or receiving the wafer;
   applying a cleaning liquid to the wafer, wherein after the application of the cleaning liquid, a portion of the cleaning liquid remains over the wafer;
   removing the portion of the cleaning liquid by applying a rinsing liquid to the wafer, wherein after the application of the rinsing liquid, a portion of the rinsing liquid remains over the wafer, and wherein the rinsing liquid has a boiling point;
   removing the portion of the rinsing liquid by applying drying fluid in gaseous state in a first direction perpendicular to a top surface of the wafer through a first heater and in a second direction perpendicular to a bottom surface of the wafer and opposite to the first direction through a second heater, wherein the drying fluid has a higher temperature than the boiling point of the rinsing liquid, and the rinsing liquid is evaporated and removed by the drying fluid, and wherein the drying fluid comprises superheated water,
   wherein after the removal of the rinsing liquid, the drying fluid remains in gaseous state; and
   applying an additional gas to the wafer during the application of the drying fluid in a third direction perpendicular to the first direction and the second direction, wherein a density of the additional gas is greater than that of the drying fluid.

2. The method as claimed in claim 1, wherein the wafer comprises:
   a substrate; and
   a first feature and a second feature over the substrate,
   wherein before the removal of the rinsing liquid, the first feature and the second feature are spaced apart from each other by a first distance,
   wherein after the removal of the rinsing liquid, the first feature and the second feature are spaced apart from each other by a second distance, wherein the second distance is substantially equal to the first distance.

3. The method as claimed in claim 1, wherein density of the additional gas is about 1.1 to 5 times the density of the drying fluid.

4. A method for drying a wafer, comprising:
   providing or receiving the wafer;
   applying a rinsing liquid in liquid state to the wafer, wherein the rinsing liquid has a boiling point;
   drying the wafer by applying a drying fluid in gaseous state to the wafer in a first direction perpendicular to a top surface of the wafer, wherein the drying fluid has a higher temperature than the boiling point of the rinsing liquid, and the rinsing liquid is evaporated and removed by the drying fluid, and wherein the drying fluid comprises superheated water,
   wherein after the removal of the rinsing liquid, the drying fluid remains in gaseous state; and
   applying an additional gas to the wafer during the application of the drying fluid in a second direction parallel to the top surface of the wafer, wherein the additional gas has a first density, and the drying fluid has a second density, wherein the first density is greater than the second density.

5. The method as claimed in claim 4, wherein the temperature of the drying fluid is in a range from about 101° C. to about 250° C.

6. The method as claimed in claim 4, wherein the first density is about 1.1 to 5 times the second density.

7. The method as claimed in claim 4, wherein the wafer comprises:
   a substrate; and
   a first feature and a second feature over the substrate,
   wherein before the removal of the rinsing liquid, the first feature and the second feature are spaced apart from each other by a first distance,
   wherein after the removal of the rinsing liquid, the first feature and the second feature are spaced apart from each other by a second distance, wherein the second distance is substantially equal to the first distance.

8. The method as claimed in claim 4, wherein a flow rate of the drying fluid is in a range from about 1 standard liters per minute (slm) to about 1000 slm.

9. The method as claimed in claim 4, wherein before applying the rinsing liquid, the method further comprises:
   applying a cleaning liquid to the wafer, wherein the cleaning liquid is removed during application of the rinsing liquid.

10. The method as claimed in claim 4, wherein a viscosity of the drying fluid is less than a viscosity of the rinsing liquid.

11. The method as claimed in claim 4, wherein the additional gas comprises air, and the drying fluid comprises $N_2$.

12. A method for drying a wafer, comprising:
   providing an apparatus, wherein the apparatus comprises:
   a chamber;
   a base in the chamber; and
   a chuck over the base;
   positioning a wafer over the base, wherein the wafer is held by the chuck, wherein the wafer comprises:
   a substrate; and
   a first feature and a second feature over the substrate;
   applying a cleaning liquid to the wafer, wherein the cleaning liquid is positioned between the first feature and the second feature and covers top surfaces of the first feature and the second feature, and the cleaning liquid comprises an aqueous acidic solution or an aqueous basic solution;
   removing the cleaning liquid by applying a rinsing liquid to the wafer, wherein the rinsing liquid has a first boiling point; and
   removing the rinsing liquid by heating and evaporating the rinsing liquid by applying a drying fluid in gaseous state to the wafer, wherein the drying fluid has a first temperature that is higher than the first boiling point of the rinsing liquid, and the drying fluid comprises superheated water; and
   applying an additional gas to the wafer, wherein a density of the additional gas is greater than that of the drying fluid.

13. The method as claimed in claim 12, wherein the apparatus further comprises:
   a first container containing a precursor fluid having a second temperature that is lower than the first temperature;
   a first pipe connecting the first container to the chamber; and
   a heating unit provided on the first pipe;

wherein the first container and the first pipe are at a first pressure, wherein the precursor fluid has a second boiling point at the first pressure, wherein the chamber has a second pressure that is lower than the first pressure, and the precursor fluid has a third boiling point at the second pressure, wherein the third boiling point is lower than the second boiling point, wherein the application of the drying fluid comprises:
supplying the precursor fluid from the first container into the first pipe, wherein in the first pipe having the first pressure, and the precursor fluid has the second boiling point, wherein while the precursor fluid flows through the heating unit, the precursor fluid is heated by the heating unit to the first temperature which is lower than the second boiling point and higher than the third boiling point;

supplying the heated precursor fluid from the first pipe into the chamber, wherein after the heated precursor fluid enters the chamber having the second pressure, the precursor fluid has the third boiling point lower than the first temperature, and the heated precursor fluid is evaporated and is transferred to the drying fluid.

14. The method as claimed in claim 12, wherein the apparatus further comprises:
a second container containing the cleaning liquid;
a second pipe connecting the second container to the chamber;
a third container containing the rinsing liquid; and
a third pipe connecting the third container to the chamber.

15. The method as claimed in claim 12, wherein the drying fluid is applied in a first direction perpendicular to a top surface of the wafer, and the additional gas is applied to the wafer during the application of the drying fluid in a second direction parallel to the top surface of the wafer.

16. The method as claimed in claim 12, wherein the additional gas comprises air, and the drying fluid comprises $N_2$.

17. The method as claimed in claim 12, wherein the apparatus further comprises:
a first container containing a precursor fluid having a second temperature that is lower than the first temperature;
a first pipe connecting the first container to the chamber; and
a heating unit provided on the first pipe;
wherein the application of the drying fluid comprises:
supplying the precursor fluid into the first pipe, wherein while the precursor fluid flows through the heating unit, the precursor fluid is heated by the heating unit and is transferred to the drying fluid having the first temperature, wherein the first temperature is higher than the first boiling point of the rinsing liquid; and;
supplying the drying fluid from the first pipe to the wafer in the chamber.

18. The method as claimed in claim 17, wherein the base comprises a top surface, a bottom surface, and a gas passage extending from the bottom surface to the top surface, wherein the apparatus further comprises a fourth pipe connecting the first pipe to the gas passage of the base, wherein the application of the drying fluid further comprises:
applying the drying fluid from the heating unit to the wafer through the fourth pipe and the gas passage of the base.

19. The method as claimed in claim 17, wherein the apparatus further comprises:
a dispensing head in the chamber and connected to the first pipe,
wherein the dispensing head has a first width, and the wafer has a second width, wherein the first width is greater than the second width.

20. The method as claimed in claim 19, wherein the dispensing head has a first area, and the wafer has a second area, wherein the first area is greater than the second area.

* * * * *